United States Patent [19]
Tomo

[11] Patent Number: 5,888,703
[45] Date of Patent: Mar. 30, 1999

[54] METHOD OF FORMING RESIST PATTERN UTILIZING ANTIREFLECTIVE LAYER CONTAINING ROSIN OR HYDROGENATED ROSIN

[75] Inventor: Yoichi Tomo, Kanagawa, Japan

[73] Assignee: Sony Corporation, Japan

[21] Appl. No.: 775,194

[22] Filed: Dec. 30, 1996

Related U.S. Application Data

[62] Division of Ser. No. 519,354, Aug. 25, 1995, abandoned.

[30] Foreign Application Priority Data

Aug. 30, 1994 [JP] Japan .................................. 6-205173

[51] Int. Cl.⁶ ................................ G03F 7/11; G03F 7/30
[52] U.S. Cl. .......................... 430/315; 430/311; 430/510; 430/512
[58] Field of Search ..................................... 430/311, 325, 430/326, 510, 315, 512

[56] References Cited

U.S. PATENT DOCUMENTS 5,227,495   7/1993   Inagaki et al. ...................... 430/270.2

*Primary Examiner*—Christopher G. Young
*Attorney, Agent, or Firm*—Ronald P. Kananen; Rader, Fishman & Grauer

[57] ABSTRACT

An antireflective layer comprises a binder component in the form of a rosin which is soluble in both a low polar organic solvent and an aqueous alkaline solution, and a light absorbing component which is also soluble in both the low polar organic solvent and the aqueous alkaline solution. In photolithography, the antireflective layer exhibits excellent anti-reflective properties in a predetermine UV wavelength region, and, when used for forming resist patterns, the antireflective layer can be applied dissolved in the low polar organic solvent in a manner which has no detrimental effect on the resist, and can be removed along with the resist during the development process using the aqueous alkaline solution.

9 Claims, No Drawings

5,888,703

METHOD OF FORMING RESIST PATTERN UTILIZING ANTIREFLECTIVE LAYER CONTAINING ROSIN OR HYDROGENATED ROSIN

This application is a divisional of application Ser. No. 08/519,354 filed Aug. 25, 1995, now abandoned.

BACKGROUND OF THE INVENTION

1. Field of the Invention

The present invention relates to materials for depositing antireflective layers, a method for forming resist patterns, and a method for manufacturing semiconductor devices.

2. Description of Related Art

The minimization has been introduced in various industrial fields, and for example in the field of electronic material (including semiconductor devices), the minimum feature size of semiconductor integrated circuit has reached to sub-half micron level.

To meet this need, the technology suitable for highly precise fine works has needed, and corresponding to the expectation, for example, KrF excimer laser lithography has attracted attentions. However, various films used in the process of manufacturing semiconductor devices mostly have high reflectance for light in wavelength region used in this technical field. The high reflectance causes the problem of standing wave effect (multiple interference in a film) and notching due to reflection from steps. For example, the variation of pattern size and pattern distortion are caused. The reflection preventing technology has been developed to avoid these problems, and the technology is categorized into the under coated antireflective layer type and the top coated antireflective layer type. Both types involve advantages and disadvantages, top coated reflection preventing technique using top coated organic layer is useful because of simple process of the technique though the technique is not so effective for notching.

Two types of antireflective layer material for deep ultraviolet, water soluble material and non-water soluble materials, are available commercially. The former is removable directly with resist developing solution in favor of simple processing, but the former mostly has high reflective index and it is difficult to find out a material having ideal refractive index. The latter, non-water soluble antireflective layer material, needs additional peeling process disadvantageously, but ideal refractive index is obtained by using fluoro polymers. Since the factor that the process is simple is considered as important from the view point of manufacturing, however, the former, namely water soluble material, is often selected. As described herein above, the use of the former material cannot result in ideal refractive index, but results in relatively high refractive index. The high refractive index involves the problem of reduced suppression of standing wave effect. In addition, the former material involves the problem of plugging of a pump of waste effluent system when the wast effluent of the former is wasted in the same effluent system that used for resist because the former is water soluble.

SUMMARY OF THE INVENTION

It is the first object of the present invention to provide an antireflective layer which exhibits reflection preventing effect for exposing light with a wavelength in a desired range when combined with photoresist, does not need specific peeling process, and is removed easily.

It is the second object of the present invention to provide a reflection preventing technique in which when an antireflective layer is used as photolithography antireflective layer for forming resist pattern, the layer is removed in developing process simultaneously.

It is the third object of the present invention to provide a method for manufacturing semiconductor devices in which the problems are solved through the attainment of the first and second objects described herein above.

The material in accordance with the present invention is an antireflective layer depositing material which is applied directly on photoresist material for forming resist pattern by exposing to deposit an antireflective layer, and comprises binder component which is soluble in low polar organic solvents and soluble in alkaline aqueous solutions and light absorbing component which is soluble in low polar organic solvents and soluble in alkaline aqueous solutions. By prescribing the antireflective layer depositing material as described herein the purposes of the present invention are attained.

In the antireflective layer depositing material in accordance with the present invention, the binder component comprises the major component of film-depositable material containing at least one of abietic acid and hydrogenated abietic acid as main acidic component. By prescribing the binder component as described herein the purposes of the present invention are attained.

In the antireflective layer depositing material in accordance with the present invention, the binder component comprises rosin or hydrogenated rosin. By prescribing the binder component as described herein, the purposes of the present invention are attained.

In the antireflective layer depositing material in accordance with the present invention, the rosin or hydrogenated rosin is Chinese rosin or hydrogenated Chinese rosin. By prescribing the rosin as described herein, the purposes of the present invention are attained.

In the antireflective layer depositing material in accordance with the present invention, the light absorbing component is phenol derivatives. By prescribing the light absorbing component as described herein, the purposes of the present invention are attained.

In the antireflective layer depositing material in accordance with the present invention, the phenol derivative is any one of pyrogallol, bis-phenol-A, and bis-phenol-H. By prescribing the phenol derivatives as described herein, the purposes of the present invention are attained.

In the antireflective layer depositing material in accordance with the present invention, the low polar organic solvent is any one of xylene, decalin, ethylbenzene, and chlorobenzene. By prescribing the low polar organic solvent as described herein, the purposes of the present invention are attained.

The present invention provides a method for forming resist pattern comprising the steps of depositing a film using photoresist material, depositing an antireflective layer by coating antireflective layer depositing material comprising the light absorbing component and binder component containing rosin or hydrogenated rosin as the main component directly on the photoresist film to deposit an antireflective layer, and, after exposing, depositing the resultant film directly with alkaline developing aqueous solution without peeling the antireflective layer. By applying the processes as described herein, the purposes of the present invention are attained.

The present invention provides a method for manufacturing a semiconductor device comprising the steps of depositing a film using photoresist material, depositing an antireflective layer by coating antireflective layer depositing material comprising the light absorbing component and binder component containing rosin or hydrogenated rosin as the main component directly on the photoresist film to deposit an antireflective layer, after exposing, developing the resultant film directly with alkaline developing aqueous solution without peeling the antireflective layer, and using the resultant resist pattern for a semiconductor device. By applying the method, the purposes of the present invention are attained.

DETAILED DESCRIPTION OF THE PREFERRED EMBODIMENTS

Because, in the present invention, the material, which is soluble in organic solvents and soluble in water and alkaline solutions, is used for depositing top coated antireflective layer, generally organic solvents has good coating performance, and such organic solvents are used for coating, and the antireflective layer can be removed directly with developing solution without addition of extra-process for removing the layer.

Rosin, for example Chinese rosin, which is soluble in low polar organic solvents such as xylene, decalin, ethylbenzene, and chlorobenzene and is soluble in alkaline aqueous solution, is available as resin material for depositing antireflective layer, and preferably these materials are used.

In general, Chinese rosin is classified into two types: abietic acid and dextropimaric acid.

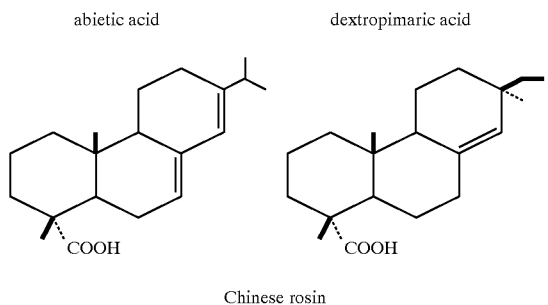

Chinese rosin

Hydrogenated products of above Chinese rosin, that is hydrogenated abietic acid and hydrogenated dextropimaric acid, are available.

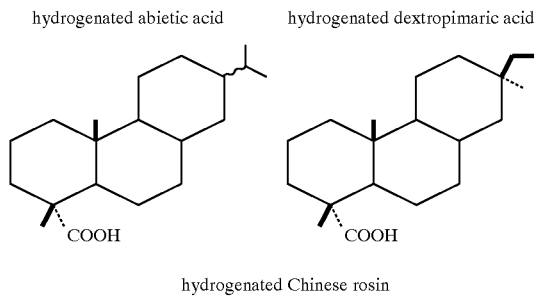

hydrogenated Chinese rosin

Among the above mentioned Chinese rosins, materials suitably used in the present invention contain much amount of any one of terpenes comprising abietic acid as the main component, and such materials have good film depositing performance.

The above mentioned property of the material, that the material is soluble in low polar solvents, means the possibility of film depositing using these solvents (film depositing by spin coat). The material which is soluble in low polar solvent means that the material is insoluble in solvents which are good solvent for resist, and the use of such material allows to coat the material on a resist film without damaging of the resist film and without inter-mixing. The material of the present invention is insoluble in water because carboxylic acid is the main component, but soluble in alkaline aqueous solution (developer). Therefore, the antireflective layer is directly peeled off in the developing process. Many modified rosin materials such as alkyd rosin and hydrogenated rosin are available other than rosin and Chinese rosin, and all these materials are film depositable and soluble in alkaline aqueous solution.

Rosin such as Chinese rosin has a refractive index which is too high to use in deep ultraviolet region as it is (n=1.46: Sopra Co., spectroscopic ellipsometry), and is incompatible with materials with low refractive index such as fluoro resin, but in the present invention, the inclusion of light absorbing component solves this problem. More in detail, the light absorbing material, which increases light absorption of the film, is soluble in the above mentioned low polar organic solvents, has an absorption band in the wavelength region to be used such as deep ultraviolet region (250 nm), and is soluble in alkaline aqueous solution, is mixed. Examples of such material include phenolic compounds with low molecular weight such as pyrogallol, bis-phenol-A, and bis-phenol-H.

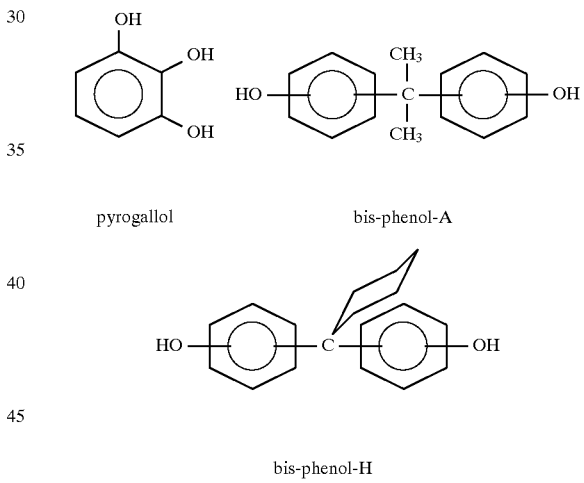

Examples of the present invention will be described in detail herein after. However, the scope of the present invention is by no means limited by the examples.

The first example of the present invention is described hereunder.

A coating solution was prepared as in the following.

10 g of hydrogenated Chinese rosin KR610 (Arakawa Chemical Co.), 1 g of pyrogallol, and 1 g of bis-phenol-A were mixed, and the mixture was dissolved in 40 ml of ethylbenzene.

The solution was filtered with a membrane filter with a pore size of 0.2 micron to prepare a coating solution. In other way, decalin solvent may be used, but in this case, it is preferable that the use of mixed solvent containing decalin and ethylbenzene or xylene in a ratio of 1:1 by volume in stead of decalin solely because poor solubility of hydrogenated Chinese rosin (brand name of KR610, referred as KR610 hereinafter), pyrogallol, and bis-phenol-A in decalin.

Herein a mixture of pyrogallol and bis-phenol-A was used, but pyrogallol or bis-phenol-A may be used solely. Other light absorbing materials may be used, provided they are soluble in low polar solvent.

A process for depositing an antireflective layer ARL using the coating solution is described herein under.

A five inch silicon wafer was dehydration baked at 200° C. for 1 minute followed by cooling to a room temperature, and subjected to prime treatment in HMDS (hexamethyldisilazane) vapor. Chemically sensitized positive resist, which comprises PHS (polyhydroxy styrene) resin introduced with t-BOC protecting group and added with photo acid generator such as 5% by weight of diphenyl iodinium triflate as the main component, was rotation coated to deposit a film with a thickness of 0.85 micron. The film was baked at 90° C. for 90 seconds, and subsequently the coating solution was coated on the film to deposit top coated anti reflective film with a thickness of 0.3 micron. The film deposition was excellent. For comparative example, a wafer having no top coated anti reflective film was prepared.

The wafer was exposed to NA: 0.42 laser generated from KrF excimer laser stepper NSR-1505EX (Nikon Co.) varying exposure dose through a reticule having line and space pattern. Afterward, the wafer was subjected to PEB (post exposure baking) at 110° C. for 90 seconds, and subjected to paddle developing in 2.38% TMAH (tetramethyl ammonium hydroxide) aqueous solution (NMD-3, TOK Co.) for 60 seconds followed by water washing and drying.

In this example using ARL, the optimal exposure dose for 0.3 micron line and space pattern was 25 mJ/cm$^2$. On the other hand, the optimal exposure dose for the comparative wafer without ARL was 20 mJ/cm$^2$.

The second example is described herein under.

An experiment was carried out in the same manner as described in the first example excepting of resist thickness of 0.86 microns. The optimal exposure dose for line and space pattern of 0.3 micron was 25.5 mJ/cm2 for the example with ARL and 22 mJ/cm2 for the comparative example without ARL.

The third example is described herein under.

An experiment was carried out in the same manner as described in the first example excepting of resist thickness of 0.87 micron. The optimal exposure dose for line and space pattern of 0.3 micron was 26 mJ/cm2 for the example with ARL and 24 mJ/cm2 for the comparative example without ARL.

The fourth example is described herein under.

An experiment was carried out in the same manner as described in the first example excepting of resist thickness of 0.88 micron. The optimal exposure dose for line and space pattern of 0.3 micron was 26.5 mJ/cm2 for the example with ARL and 26 mJ/cm2 for the comparative example without ARL.

DISCUSSION OF EXAMPLES

It is found that in the case without ARL, the exposure dose to obtain the same dimensional changes significantly depending on the change in the resist thickness, but in the case of with ARL, the exposure dose changes insignificantly.

In the present invention, the layer is deposited by using organic solvent, which is more excellent in coating performance than water, directly on a resist film without depositing mixing layer, and after exposure and PEB, the top coated ARL layer is peeled off directly with developing solution during developing process simultaneously without additional peeling process. The disadvantage that the refractive index of the layer is higher than the optimal value is eliminated to provide suitable absorption, thereby the dimensional variation due to standing wave effect is effectively suppressed.

The antireflective layer used in the examples contains acidic polymer, and the acidic polymer protects photoresist composition. For example, when the atmospheric gas contains basic gas such as amine, the acidic polymer neutralizes the basic gas to prevent the adverse effect on the photoresist composition.

According to the present invention, an advantageous antireflective layer, which exhibits reflection preventing effect in a desired wavelength region by incorporating the layer, does not need specific peeling process, and is removed easily, is obtained. There is provided an antireflective technique, in which when an antireflective layer is used as antireflective layer for photolithography for forming resist pattern, the layer exhibits excellent antireflective effect and is removed in developing process simultaneously. There is provided a method for manufacturing semiconductor devices having advantages described herein above.

What is claimed is:

1. A method for forming a resist pattern on a surface, comprising the steps of:

processing a photoresist material to deposit a photoresist film on the surface;

coating the surface with an antireflective layer depositing material containing a light absorption component and a binder component comprising rosin or hydrogenated rosin as a main component in the binder component directly on said photoresist film to deposit an antireflective layer; and after selective exposure, simultaneously developing said photoresist film and removing said antireflective layer using an alkaline aqueous developing solution.

2. A method for forming a resist pattern according to claim 1, wherein said antireflective layer is soluble in a low polar organic solvent.

3. A method for forming a resist pattern according to claim 1, wherein the rosin or hydrogenated rosin in the binder component comprises a film-depositable material containing at least abietic acid or hydrogenated abietic acid.

4. A method for forming a resist pattern according to claim 3, wherein said rosin or hydrogenated rosin is respectively Chinese rosin or hydrogenated Chinese rosin.

5. A method for forming a resist pattern according to claim 1, wherein said light absorbing component is a phenol derivative.

6. A method for forming a resist pattern according to claim 5, wherein said phenol derivative is selected from the group consisting of pyrogallol, bis-phenol A, and bis-phenol-H.

7. A method for forming a resist pattern according to claim 2, wherein said low polar organic solvent is selected from the group consisting of xylene, decalin, ethylbenzene, and chlorobenzene.

8. A method for forming a resist pattern according to claim 1 wherein said exposure step is performed by using a deep ultraviolet light.

9. A method for making a semiconductor device comprising the steps of:

processing photoresist material to deposit a photoresist film on a substrate;

coating the substrate with an antireflective layer depositing material containing a light absorption component and a binder comprising rosin or hydrogenated rosin as a main component of the binder directly on said photoresist film to deposit an antireflective layer;

after exposure, simultaneously developing the photoresist film and removing said antireflective layer to form a resist pattern using an alkaline aqueous developing solution; and using said resist pattern for making said semiconductor device.

* * * * *